United States Patent
Lering et al.

(10) Patent No.: US 6,881,914 B2
(45) Date of Patent: Apr. 19, 2005

(54) APPARATUS AND METHOD FOR HANDLING, STORING AND RELOADING CARRIERS FOR DISK-SHAPED ITEMS, SUCH AS SEMICONDUCTOR WAFERS OR CDS

(75) Inventors: Michael Lering, Bubenreuth (DE); Reiner Missale, Hemau (DE); Martin Peiter, Dresden (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 131 days.

(21) Appl. No.: 10/298,831

(22) Filed: Nov. 18, 2002

(65) Prior Publication Data

US 2003/0076752 A1 Apr. 24, 2003

Related U.S. Application Data

(63) Continuation of application No. PCT/EP01/04413, filed on Apr. 18, 2001.

(30) Foreign Application Priority Data

May 16, 2000 (EP) .............................................. 00110455

(51) Int. Cl.[7] .......................... B65G 49/07; B07C 5/344
(52) U.S. Cl. ...................... 209/571; 209/573; 414/937
(58) Field of Search ............................. 209/571, 572, 209/573; 414/937, 940; 34/79, 202; 134/902

(56) References Cited

U.S. PATENT DOCUMENTS 5,698,040 A * 12/1997 Guldi et al. ................. 134/1.3

5,972,727 A   10/1999 Ryan et al.
5,991,965 A * 11/1999 Stroh et al. ................... 15/310
6,096,100 A *  8/2000 Guldi et al. ................ 29/25.01
6,280,134 B1   8/2001 Nering

FOREIGN PATENT DOCUMENTS

| EP | 0 335 752 A2 | 10/1989 | |
| JP | 05326476 A  * | 12/1993 | ......... H01L/21/304 |
| WO | WO 99/18603 | 4/1999 | |
| WO | WO 00/22653 | 4/2000 | |

OTHER PUBLICATIONS

Author not listed: "Sorting and Transfer Drive Mechanism", IBM Technical Disclosure Bulletin, vol. 33, No. 6A, Nov. 1990, pp. 134–143.

Sherwood E. et al.: "Integrated Minienvironment Design Best Practices", International Sematech, Technology Transfer # 99033693A–ENG, Mar. 1999, pp. 1–14.

* cited by examiner

Primary Examiner—Donald P. Walsh
Assistant Examiner—Joseph Rodriguez
(74) Attorney, Agent, or Firm—Laurence A. Greenberg; Werner H. Stemer; Ralph E. Locher

(57) ABSTRACT

An apparatus for handling, storing and reloading carriers for disk-shaped items, such as semiconductor wafers or CDs, has at least one cleaning unit and at least one storage unit for the carriers containing the disk-shaped items. The apparatus further has at least one sorting unit for the disk-shaped items. The cleaning unit, the storage unit and the sorting apparatus are integral component parts of the apparatus and are operated by a common automatic control.

11 Claims, 3 Drawing Sheets

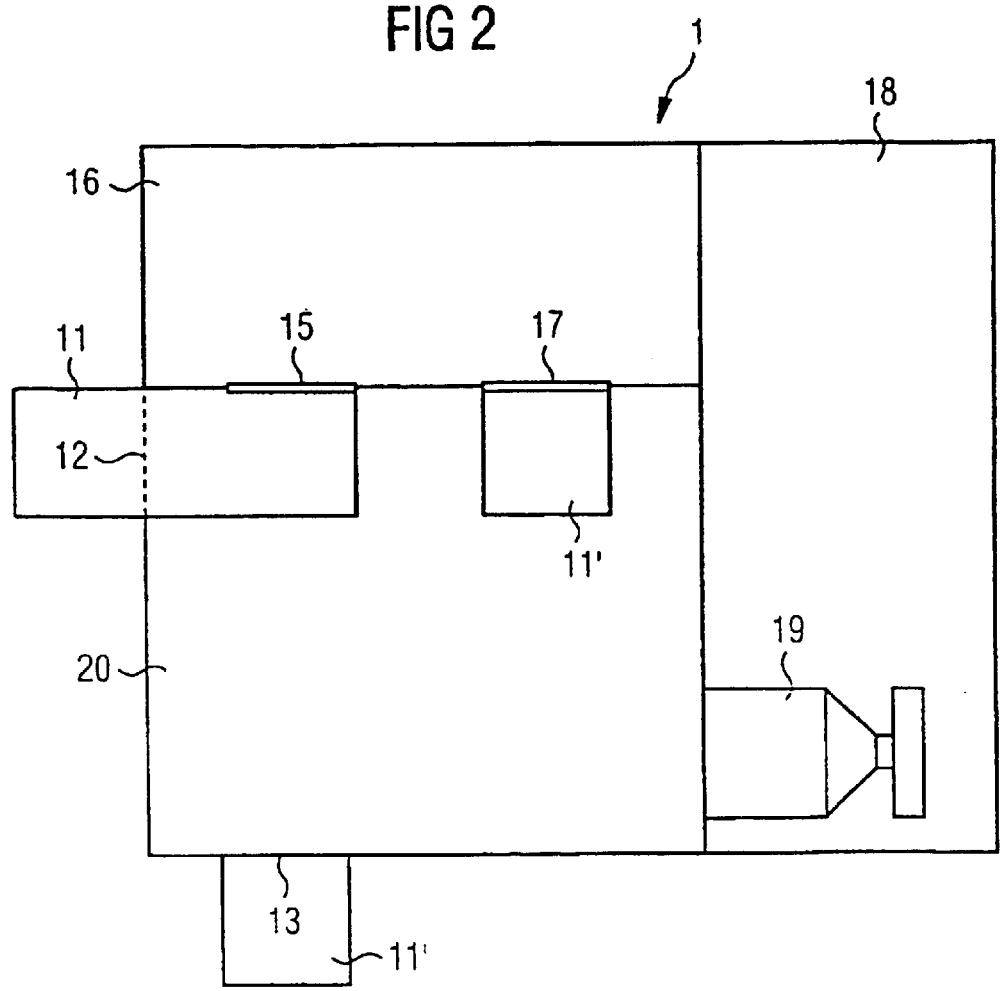

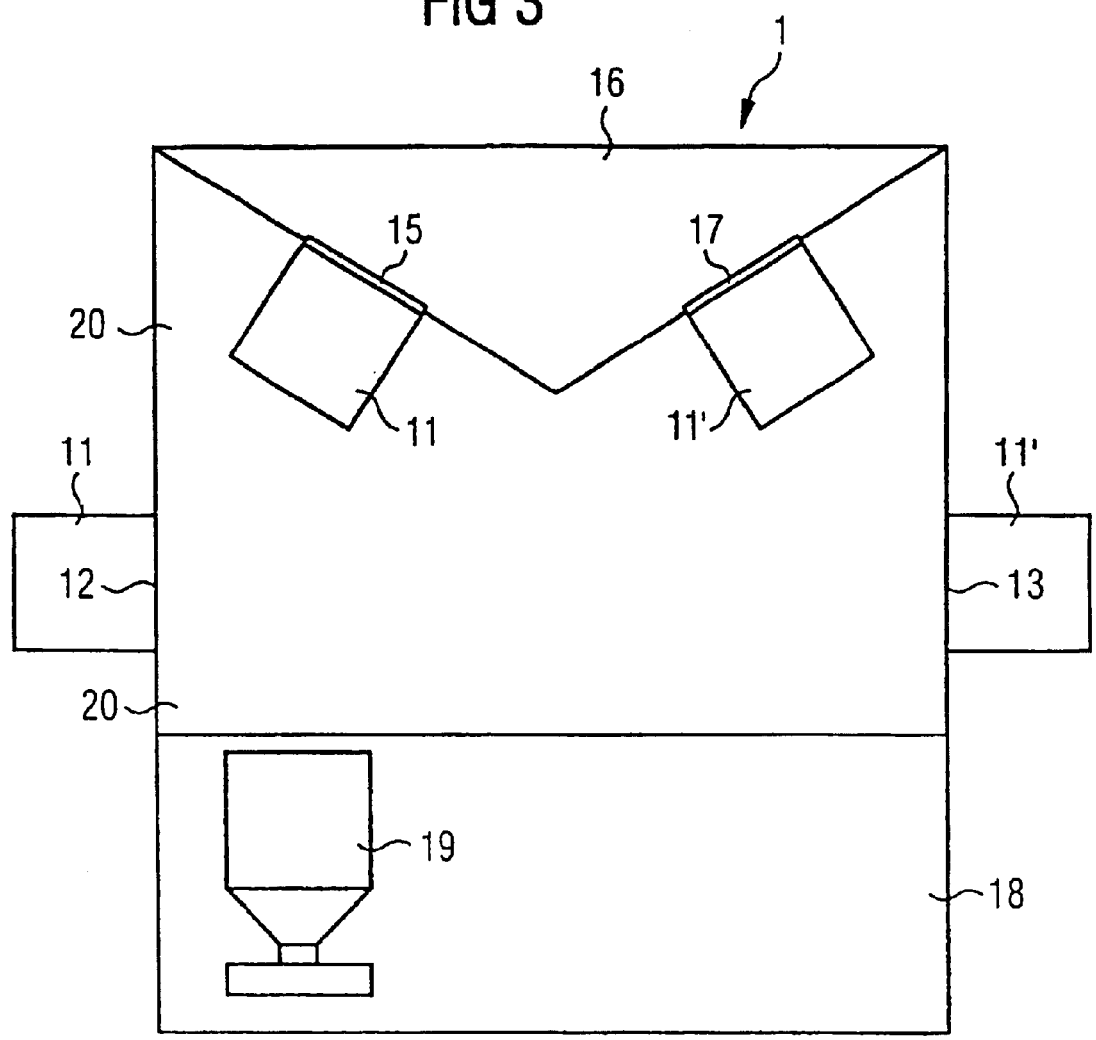

APPARATUS AND METHOD FOR HANDLING, STORING AND RELOADING CARRIERS FOR DISK-SHAPED ITEMS, SUCH AS SEMICONDUCTOR WAFERS OR CDS

CROSS-REFERENCE TO RELATED APPLICATIONS

This application is a continuation of copending International Application No. PCT/EP01/04413, filed Apr. 18, 2001, which designated the United States and was not published in English.

BACKGROUND OF THE INVENTION

Field of the Invention

The present invention relates to an apparatus and a method for handling, storing and reloading carriers for disk-shaped items, such as semiconductor wafers or CDs.

In the semiconductor industry, during the production and processing of semiconductor wafers, for example of silicon, (which are likewise also known as substrates), the semiconductor wafers undergo a large number of processing steps. The method steps are usually performed in process machines at separate locations. On account of the different processing times in the individual process machines, it is therefore necessary to collect the wafers at a suitable point, to allow the wafers to be constantly fed to the individual processing units. Furthermore, the wafers must be transported between the individual apparatuses.

For storage and transport, carriers that can receive a number of wafers and from which the wafers can be individually removed are generally used in semiconductor technology. The carriers are usually in the form of a magazine (also known as a cassette), in which the wafers are stored horizontally. The carrier is preferably held in a box (also known as a pod), which has a door on its front side. Such a box is described, for example, in SEMI Standard E47.1. These boxes are referred to as front opening unified pods (FOUP). In the individual processing steps, contaminants may occur on account of the mechanical or chemical processing and may also collect in the carriers.

In particular in the field of semiconductor technology, the cleaning of carriers and containers in which the wafers are transported from one processing station to the next, or in which they are temporarily stored, is of significance, since the cleanliness of the carriers and containers has an influence on the cleanliness of the wafer surfaces, and consequently on the wafer quality that can be achieved. The intention is to achieve the lowest possible particulate and molecular contamination.

In particular in the case of what is known as work-in-progress (WIP) material, on which the processing has already begun but has not yet been completed, the meeting of cleanliness requirements is of special significance.

In addition to the requirement for the cleanliness of the wafers and wafer carriers, in the semiconductor industry there are efforts to reduce the costs per wafer handled. To achieve this aim, the throughput of a processing system must be increased and the system costs reduced. The throughput is mainly influenced by the handling time. In addition to the actual handling time of the wafers, however, there are also unproductive times, in which the wafer is not undergoing any handling but is merely awaiting the next handling step, or in which the wafers are being transported from one processing system to the next.

SUMMARY OF THE INVENTION

It is accordingly an object of the invention to provide an apparatus and a method for handling, storing and reloading carriers for disk-shaped items, such as semiconductor wafers or CDs that overcome the above-mentioned disadvantages of the prior art devices and methods of this general type, with which the throughput of a processing system for disk-shaped items is increased and, in particular, a high level of productivity is made possible. Furthermore, the apparatus is intended to be easy and reliable to operate.

With the foregoing and other objects in view there is provided, in accordance with the invention, an apparatus for handling, storing and reloading carriers for disk-shaped items. The apparatus contains at least one cleaning unit, at least one storage unit for storing the carriers, and at least one sorting unit for sorting the disk-shaped items. The cleaning unit, the storage unit and the sorting apparatus are integral component parts and are operated by a common automatic control.

The invention is based on the idea that the object can be achieved by an apparatus and a method with which decentralized storage and cleaning of a required auxiliary material is made possible and is ideally integrated into the material flow of the items to be handled.

The object is achieved according to the invention by an apparatus for handling, storing and reloading carriers for disk-shaped items, such as semiconductor wafers or CDs. The apparatus contains at least one cleaning unit, at least one store for the carriers, and at least one sorting unit for the disk-shaped items. The cleaning unit, the storage unit and the sorting unit are integral component parts of the apparatus and are operated by a common automatic control.

In the text that follows, reference is mainly made to the handling of the carriers for wafers. However, the apparatus according to the invention can be used for any disk-shaped items, in particular if their handling requires a high level of cleanliness during auxiliary processes.

The apparatus according to the invention combines the process units for cleaning and storing the carriers and also the sorting of the disk-shaped items in one assembly, known as a cluster. The assembly is operated by the common automatic control of the units. In addition, the configuration according to the invention makes the entire apparatus have a low space requirement.

As far as the advantages, effects and operating mode of the apparatus according to the invention are concerned, reference is likewise made to the full content of the comments that follow concerning the method according to the invention, and you are hereby referred to them.

The main advantage of such an apparatus is therefore the reduction of what are known as footprints. A footprint represents the surface area required by an item of equipment in a clean room, the surface area requirement being determined either with or without the required service areas. The apparatus according to the invention has the effect of reducing the clean room area requirement, since the transporting paths between the individual component parts of the apparatus are eliminated or reduced on account of the internal interconnection.

Furthermore, a reduction of the time per throughput cycle, in particular unproductive times for wafer processing, by about four to eight times per handled wafer is achieved. Finally, the reduction of the required transporting movements is also of advantage in the case of the apparatus according to the invention.

If a carrier that contains one or more disk-shaped items, in particular wafers, is fed to the apparatus, the disk-shaped items can be removed from the carrier by the sorting unit and fed to another carrier. The carrier emptied in this way can then be fed to the cleaning unit. After cleaning, the carrier is fed to the internal storage unit, where it is available for renewed loading. The carrier fitted with the items of the emptied carrier can then be fed by the apparatus by transporting units to further processing units. The transporting of the carriers within the apparatus, for example from the cleaning unit to the internal store, takes place by automated transporting systems. The transporting systems are controlled by the common automatic control of the apparatus, and consequently the presence of a carrier at the point in the apparatus at which it is required, for example at the sorting device for receiving items from a carrier to be emptied, is ensured.

The apparatus may advantageously also have at least one measuring unit for the carriers. The measurement of the carriers for maintenance of the necessary tolerances can consequently be included in the cluster. The measurement of the carrier is preferably carried out directly after the cleaning. In this way, the carrier can be fed to the store, from where the cleaned and measured carrier can then be loaded with disk-shaped items directly by the sorting unit and fed to the next method step. This additional unit in the cluster consequently avoids renewed emptying of the carrier for measuring purposes at a later point in time.

The apparatus has at least one loading opening (also known as a load port) for respectively feeding or carrying away the carriers. Two loading openings are preferably provided, one serving for the feeding of carriers to the apparatus and the other for the carrying away of carriers. The loading openings are configured in particular for being used for wafer carriers, preferably in conformity with the SEMI Standard E 15.1. The content of the SEMI Standard E 15.1 is hereby incorporated into the description by reference. According to the standard, the loading opening is configured in such a way that it creates an interface between the apparatus and automated or manual transporting systems for wafer carriers.

The sorting unit preferably has at least two mechanical interfaces for respectively feeding and carrying away disk-shaped items. The interfaces make it possible for the disk-shaped items on the one hand to be removed from a carrier fed to the apparatus and on the other hand to be fed to a predetermined carrier which has been removed from the store. The provision of at least two interfaces makes it unnecessary for the disk-shaped items to be temporarily stored in the sorting unit.

In particular when the apparatus is used for wafer carriers, the mechanical interfaces are configured in conformity with the SEMI Standard E 62. The content of this standard is hereby incorporated in the description by reference. The standard describes what are known as front-opening-interface-mechanical-standard (FIMS) interfaces or loading openings, by which the transfer of wafers between a processing unit and a transporting container is made possible, the transporting container having the form of a box and having a door on its front side. The containers, in which the wafer carriers may be configured as removable or fixedly mounted magazines, are referred to as front opening unified pods (FOUPs) and are described in SEMI Standard E 47.1. The cleaning unit may also be configured in such a way that, when such boxes are used, they can also be cleaned.

According to a preferred embodiment, the apparatus contains at least one data recognition unit and at least one data allocation unit for the carriers.

The data recognition unit and the data allocation unit improve the common automatic control of the apparatus (of the cluster).

In semiconductor technology in particular, carriers for disk-shaped items are configure in such a way that they can be assigned data. This preferably takes place by sensors in the bottom of the carrier or the box in which the carrier is held. The configuration of the sensors is described, for example, in SEMI Standard E 1.9. The content of the standard with respect to the configuration of the bottom of the box and the configuration of the sensors is hereby incorporated in the description by reference. In addition to the sensors, kinematic connections are also preferably disposed on the bottom of the box.

The sensors can be used to pass information concerning the wafers held in the carrier to corresponding sensors, for example in the loading opening of the apparatus. By providing the data recognition and the data allocation unit in the apparatus according to the invention, the data of the carriers that are fed to the apparatus can be recognized. The apparatus obtains information on the number of wafers held in the carrier and, if appropriate, additional information on the individual wafers. Once the data recognition device at the loading opening has received the information, the carrier into which the wafers of the incoming carrier can be transferred is located in the store on the basis of the data. Once the transfer operation has been performed by the sorting unit, the relevant information is allocated to the new carrier in the form of data by the data allocation unit. The carrier, which has been reloaded and provided with the relevant data, can then be fed to further processing apparatuses.

In a further preferred embodiment, the apparatus contains at least one identification and path-indicating unit for the disk-shaped items.

The unit, which is preferably assigned to the sorting unit, identifies an item removed from a carrier and allocates it a specific transfer path. This path determines the position that the item will assume in the new carrier into which it is being transferred.

The apparatus may preferably have an opening mechanism for boxes in which the carriers of the items are held. The carriers are preferably transported in boxes to prevent damage to the items and soiling of the items by environmental influences. In the field of semiconductor technology, FOUPs are used in particular. These have on their front side a door that makes access to individual wafers possible. In the apparatus according to the invention, the opening of the boxes is necessary at the interface with the sorting unit, where the wafers are removed from one carrier and fed to another carrier. The opening of the door can be performed by suction mechanisms, for example by suction cups, or else by mechanically or hydraulically controlled lifting or gripping mechanisms.

The cleaning unit may be configured for cleaning one carrier at a time, or allow the simultaneous cleaning of a number of carriers. The cleaning may be performed with deionized water or on a solvent basis. The transporting apparatus for the carriers preferably also supports the cleaning unit, so that there is no longer any need for an additional transfer operation from the transporting apparatus which is responsible for transporting the carriers from the loading opening to the sorting unit and from there to the cleaning unit, and also from the cleaning unit to the store and from there to the sorting unit as far as the unloading opening, onto a transporting apparatus in the cleaning unit.

The invention also relates to a method of handling and storing carriers for disk-shaped items in which an apparatus according to the invention is used.

According to the invention, the method has the following steps:

a) a carrier which contains one or more disk-shaped items is fed to the apparatus;

b) the disk-shaped items are removed and fed to another carrier by a sorting unit;

c) the emptied carrier is fed to a cleaning unit and cleaned there;

d) subsequently, the cleaned carrier is fed to an internal store, where it is available for renewed loading.

The carrier is preferably measured after or during step c).

Advantageously, the carrier fitted with disk-shaped items according to step b) is fed by the apparatus to other processing units.

As far as the advantages, effects and operating mode of the method according to the invention are concerned, reference is likewise made to the full content of the above comments concerning the apparatus according to the invention, and you are hereby referred to them.

According to one advantageous embodiment of the method, a carrier can be brought to the loading opening of the apparatus according to the invention by suitable automated or manual transporting systems. At the loading opening, the data assigned to the carrier can be fed to the common automatic control by a suitable data recognition system. On the basis of the data, the carrier is transported from the storage unit or directly from the cleaning unit, or if appropriate from the measuring unit, to a mechanical interface of the sorting unit. At the same time or before, the carrier fed to the apparatus is transported to a further mechanical interface of the sorting unit. At the sorting unit, the door which is provided on the front side of the box which holds the carrier is opened by the opening mechanism and consequently access is made possible for a transfer apparatus provided in the sorting unit to the individual items of the incoming carrier. The transfer apparatus transfers every item to the carrier that by now is waiting at the further mechanical interface. The carrier loaded in this way is assigned by the common automatic control the data of the items which it has received, and the carrier reloaded in this way is brought by a transporting apparatus to an unloading opening of the apparatus, where it can be taken up by automated or manual transporting systems and fed to further processing apparatuses.

The carrier from which the items were removed in the apparatus can be brought to the cleaning unit by the transporting systems within the apparatus. At the cleaning unit, the carrier is subjected to cleaning and, if appropriate, is subsequently measured. If the carrier is inside a box (pod), described further above, this may also be subjected to cleaning by the cleaning unit. The carrier is subsequently either fed directly to the mechanical interface of the sorting unit, at which it is loaded with items of another carrier, or the carrier is fed to the store, where it remains until it is brought by the transporting system to the interface of the sorting unit.

An apparatus and/or a method for handling and storing carriers for disk-shaped items that are wafers, for example 300 mm wafers, is preferred.

When handling wafers, a method in which a number of handling steps for auxiliary material, in this case the cleaning, storing and charging of carriers, and if appropriate the measuring of carriers, in particular FOUPs, can be combined in a cluster is of special significance. Such a logistical cluster on the one hand allows the handling time of the carriers, which represents unproductive time for the throughput of the wafer processing, to be minimized and on the other hand allows the number of process steps for this handling operation to be minimized. In particular, with respect to the requirement that wafers are to be held in a specific cleaned carrier, only a single transfer operation is necessary. As a result, it is possible for example to provide the cleaning unit, sorting unit and the store within the clean room, allowing for example copper carriers to be kept in an internal process cycle of the apparatus.

The cluster preferably contains an internal store, what is known as an equipment front end module (EFEM), as a component part of the loading opening according to SEMI Standard E 15.1 and internal wafer loading openings, kinematic connections, sensors, carrier ID recognition units, PI/O (including a communication interface via which specific items of information for controlling the transfer of the carrier from/to the load port are exchanged), opening mechanisms for boxes, a store and transporting apparatuses for carriers and also wafer transfer apparatuses under mini-environment conditions, ID recognition units and path-indicating units for the wafers.

The requirements for such mini-environment conditions are described for example in the document titled "Integrated Mini-Environment Design Best-Known Practices", International SEMATECH Technology Transfer '99033693A-ENG, SEMATECH Technology Transfer, 2706 Montopolis Drive, Austin, Tex. 78741, USA, http://www.sematech.org.

The cluster may be connected to the host system. The size of the internal store depends on the required cleaning and measuring cycle.

Other features which are considered as characteristic for the invention are set forth in the appended claims.

Although the invention is illustrated and described herein as embodied in an apparatus and a method for handling, storing and reloading carriers for disk-shaped items, such as semiconductor wafers or CDs, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic representation of an embodiment of the apparatus according to the invention in which the loading and unloading openings are disposed on adjacent sides; and FIG. 3 is a schematic representation of an embodiment of the apparatus according to the invention in which the loading and unloading openings are disposed on opposite sides.

DESCRIPTION OF THE PREFERRED EMBODIMENTS

Figure 1:
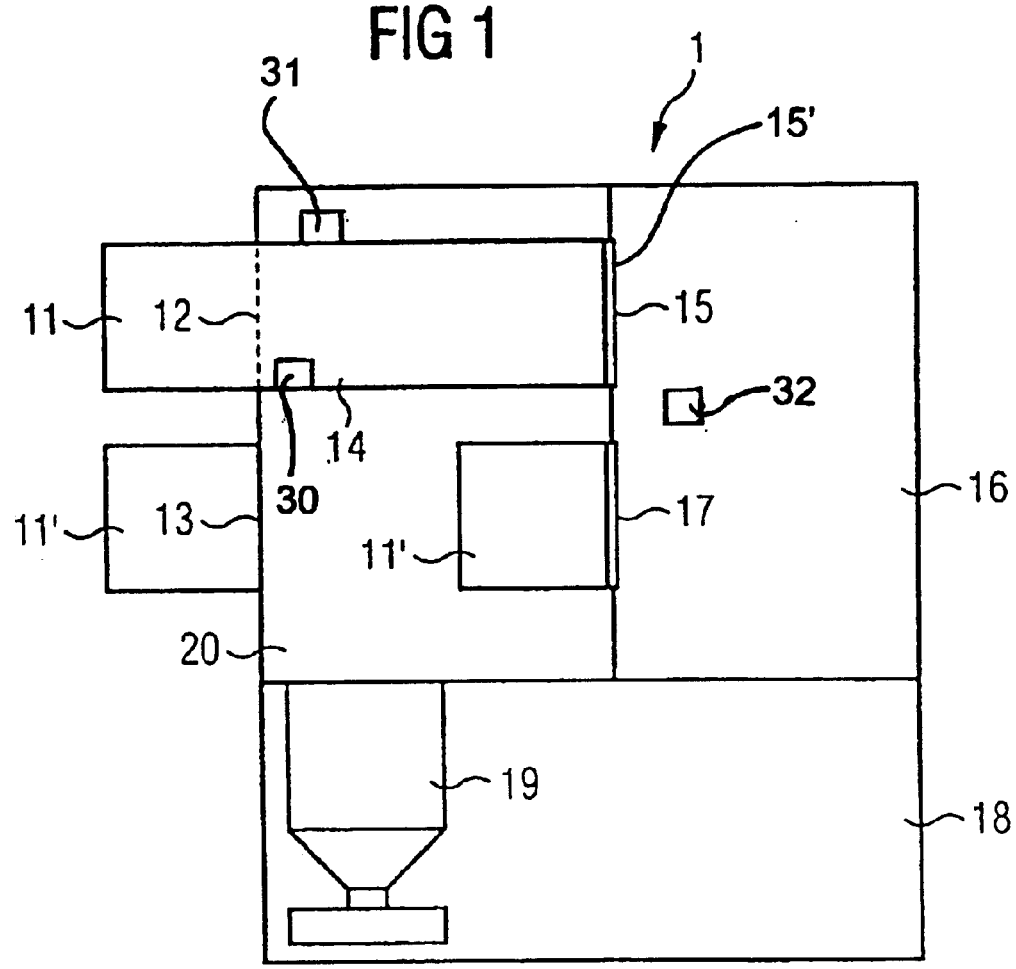
FIG. 1 is a schematic representation of an embodiment of an apparatus according to the invention, in which the loading and unloading openings are disposed on one side.

Referring now to the figures of the drawing in detail and first, particularly, to FIG. 1 thereof, there is shown an apparatus 1 according to the present invention, which forms an integral structural unit and is also referred to as a cluster. Provided on the left side are two loading openings 12, 13, one opening 12 serving for feeding carriers 11 to the apparatus 1 and the other opening 13 serving for carrying away carriers 11' from the apparatus 1. In the embodiment represented, the loading opening 12 is provided with an extended feeding region 14. Such an extended feeding region 14 may serve for receiving a number of carriers 11. Provided at an end of the feeding region 14 is a mechanical interface 15. The mechanical interface 15 serves for the connection between the feeding region 14 and a sorting unit 16. The mechanical interface 15 is preferably configured as a FIMS in conformity with the SEMI Standard E 62. It allows access for a non-illustrated transfer apparatus of the sorting unit 16 to individual items that are held in the carrier 11. If the carrier 11 is configured in conformity with the SEMI Standard E 47.1, that is if it has in particular a box in which the carrier 11 is held, the mechanical interface 15 may additionally have an opening mechanism 15' for the door of the box. In addition to the mechanical interface 15, a further mechanical interface 17 is provided, by which the transfer apparatus of the sorting unit 16 can feed the items removed from the carrier 11 to a further carrier 11'. The mechanical interface 17 is also preferably configured as a FIMS in conformity with SEMI Standard E 62. Provided alongside the sorting unit 16 is a cleaning unit 18. The cleaning unit 18 may be configured for cleaning individual carriers 11 and also a number of carriers 11 simultaneously.

Furthermore, a measuring unit 19 is provided in the apparatus 1. This is represented in FIG. 1 as a component part of the cleaning unit 18. It may, however, also be provided as a spatially separate unit within the apparatus 1. Provided adjacent to the mechanical interface 17 is a storage unit 20. The storage unit 20 may be of a vertical or horizontal form. The carriers 11' that are received in it after the cleaning and measurement can consequently be disposed one next to the other or one on top of the other.

In semiconductor technology in particular, the carriers 11, 11' for disk-shaped items are configure in such a way that they can be assigned data. This preferably takes place by sensors 30 in the bottom of the carrier 11 or the box in which the carrier is held. The configuration of the sensors is described, for example, in SEMI Standard E 1.9. In addition to the sensors, kinematic connections are also preferably disposed on the bottom of the box.

The sensors 30 can be used to pass information concerning the wafers held in the carrier 11 to corresponding sensors 31, for example in the loading opening of the apparatus. By providing the data recognition and data allocation units 30, 31 in the apparatus according to the invention, the data of the carriers 11 that are fed to the apparatus can be recognized. The apparatus obtains information on the number of wafers held in the carrier 11 and, if appropriate, additional information on the individual wafers. Once the data recognition device 31 at the loading opening has received the information, the carrier 11 into which the wafers of the incoming carrier can be transferred is located in the store on the basis of the data. Once the transfer operation has been performed by the sorting unit 16, the relevant information is allocated to the new carrier in the form of data by the data allocation unit. The carrier, which has been reloaded and provided with the relevant data, can then be fed to further processing apparatuses.

In a further preferred embodiment, the apparatus contains at least one identification and path-indicating unit 32 for the disk-shaped items.

The unit 32, which is preferably assigned to the sorting unit 16, identifies an item removed from the carrier and allocates it a specific transfer path. The path determines the position that the item will assume in the new carrier into which it is being transferred.

Represented in FIG. 2 is a further embodiment of the apparatus according to the invention 1. This embodiment corresponds substantially to the apparatus shown in FIG. 1. In the case of the embodiment shown in FIG. 2, the loading opening 13 for carrying away charged carriers 11' is disposed on the side that is adjacent to the side on which the loading opening 12 is disposed. This configuration of the loading openings 12, 13 creates additional space for the storage unit 20.

In the embodiment shown in FIG. 3, the loading openings 12, 13 are disposed on opposite sides of the apparatus 1. The sorting unit 16 is disposed in such a way that its mechanical interfaces 15, 16 are at an angle in relation to the loading opening 12 or 13, respectively. In the case of the embodiment represented in FIG. 3, the sorting device 16 projects as a tip into the storage unit 20 and the cleaning unit 18 is disposed on the opposite side of the storage unit 20. This configuration increases the space in which the carriers can be transported and, in addition, the apparatus can be reversed with respect to the feeding and carrying-away operations. In this embodiment, the loading opening 13 may also be used as a feeding opening for loaded carriers and the loading opening 12 may be used as a carrying-away opening. Even if the method sequence is reversed, the paths covered by the carriers 11, 11' are not made any longer.

The embodiments represented in the figures are used with preference for the loading, storage and cleaning, and if appropriate measurement, of carriers for wafers, in particular of carriers which are configured as FOUPs for 300 mm wafers.

The transporting systems used in the apparatus according to the invention for transporting the carriers within the apparatus may be configured as robot arms, for example gripping arms, or else as conveyor belts or the like.

The transfer apparatus provided in the sorting unit may be configured for example as a robot arm. The mechanical interfaces of the sorting unit are preferably disposed in such a way that they can be reached by the transfer apparatus, for example by rotation, without necessitating an additional moving operation, for example shifting of the transfer apparatus.

It is also within the scope of the invention to provide temporary storage of items in the sorting unit. Such temporary storage can allow for a lack of cleaned carriers.

We claim:

1. An apparatus for handling, storing and reloading carriers for disk-shaped items, the apparatus comprising:

at least one cleaning unit;

at least one storage unit for storing the carriers, said storage unit having a first load opening for receiving the carriers and a second load opening for outputting the carriers; and at least one sorting unit for sorting the disk-shaped items, said cleaning unit, said storage unit and said sorting unit being integral component parts and operated by a common automatic control, said sorting unit having at least two mechanical interfaces for respectively feeding and carrying away the disk-shaped items; and said first load opening being connected to a first of said two mechanical interfaces of said sorting unit for feeding the disk-shaped items to said sorting unit and said second load opening being connected to a second of said two mechanical interfaces of said sorting unit for outputting the disk-shaped items into a carrier.

2. The apparatus according to claim 1, further comprising at least one measuring unit for measuring the carriers.

3. The apparatus according to claim 1, wherein said cleaning unit cleans a number of the carriers simultaneously.

4. The apparatus according to claim 1, wherein the disk-shaped items are selected from the group consisting of semiconductor wafers and CDs.

5. The apparatus according to claim 1, further comprising:
at least one data recognition unit disposed in said storage unit; and
at least one data allocation unit disposed in each of the carriers.

6. The apparatus according to claim 1, further comprising at least one identification and path-indicating unit for the disk-shaped items and disposed in said sorting unit.

7. The apparatus according to claim 1, wherein said sorting unit has an opening mechanism for boxes in which the carriers of the disk-shaped items are held.

8. The apparatus according to claim 1, wherein said cleaning unit cleans one of the carriers at a time.

9. A method for handling, storing and cleaning carriers for disk-shaped items, which comprises the steps of:

providing an apparatus having a cleaning unit, a storage unit and a sorting unit;

feeding a carrier containing disk-shaped items to a first loading opening of the storage unit connected to a first mechanical interface of the sorting unit;

using the sorting unit for removing the disk-shaped items from the carrier and feeding the disk-shaped items into the sorting unit through the first mechanical interface and removing the disk-shaped items from the sorting unit through a second mechanical interface of the sorting unit to a further carrier;

outputting the further carrier through a second loading opening of the storage unit connected to the second mechanical interface;

feeding emptied carrier to the cleaning unit;

cleaning the carrier in the cleaning unit resulting in a cleaned carrier; and feeding the cleaned carrier to the storage unit where the cleaned carrier can be reloaded with additional disk-shaped items.

10. The method according to claim 9, which comprises measuring the carrier after performing the cleaning step.

11. The method according to claim 9, which comprises feeding the further carrier with the disk-shaped items to other processing units.

* * * * *